(12) United States Patent
Ben Bakir et al.

(10) Patent No.: US 8,761,220 B2
(45) Date of Patent: Jun. 24, 2014

(54) HETEROGENEOUS LASER WITH HIGH EFFICIENCY AND METHOD FOR MANUFACTURING THE LASER

(75) Inventors: Badhise Ben Bakir, Brezins (FR); Nicolas Olivier, Teche (FR); Jean-Marc Fedeli, Saint-Egreve (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/988,200

(22) PCT Filed: Nov. 18, 2011

(86) PCT No.: PCT/FR2011/000611
§ 371 (c)(1),
(2), (4) Date: May 17, 2013

(87) PCT Pub. No.: WO2012/066200
PCT Pub. Date: May 24, 2012

(65) Prior Publication Data
US 2013/0259077 A1 Oct. 3, 2013

(30) Foreign Application Priority Data
Nov. 18, 2010 (FR) ...................... 10 04493

(51) Int. Cl.
*H01S 5/00* (2006.01)
(52) U.S. Cl.
USPC ..................... 372/50.1; 372/50.22; 372/44.01
(58) Field of Classification Search
USPC ................... 372/50.1, 50.22, 44.01
See application file for complete search history.

(56) References Cited

U.S. PATENT DOCUMENTS

2007/0147762 A1* 6/2007 Kwakernaak et al. ........ 385/131
2007/0160326 A1* 7/2007 Kwakernaak et al. .......... 385/37

OTHER PUBLICATIONS

Fang et al., "A Distributed Bragg Reflector Silicon Evanescent Laser," *IEEE Photonics Technology Letters*, Oct. 15, 2008, pp. 1667-1669, vol. 20, No. 20.
Ben Bakir et al., "Electrically driven hybrid Si/III-V lasers based on adiabatic mode transformers," *Proceedings of SPIE*, 2010, pp. 7719F-1-7719-9, vol. 7719.
Sysak et al., "Reduction of hybrid silicon laser thermal impedance using Poly Si thermal shunts," *2010 7th IEEE International Conference on Group IV Photonics(GFP)*, Sep. 1, 2010, pp. 296-298, Piscataway, USA.
Fang et al., "Heterogeneous Integration of Silicon and AlGaInAs for a Silicon Evanescent Laser," *Proceedings of SPIE*, 2006, pp. 61330W-1-61330W-8, vol. 6133.
Chang et al., "1310nm silicon evanescent laser," *Optics Express*, Sep. 3, 2007, pp. 11466-11471, vol. 15, No. 18. pp. 11466-11471.
Sun et al., "Hybrid Electrically Pumped Evanescent Si/InGaAsP Lasers," *2009 IEEE Conference on Optical Fiber Communication*, Mar. 22, 2009, Piscataway, USA.

(Continued)

*Primary Examiner* — Kinam Park
(74) *Attorney, Agent, or Firm* — Oliff PLC

(57) ABSTRACT

The laser includes an amplifier with III-V heterostructure, designed to generate an optical wave, and a waveguide coupled optically to the amplifier, said waveguide having a hat-shaped cross section, the top of which is proximal to the amplifier. The top of the hat and the lateral sides of the hat are covered with a layer of a dielectric material in the vicinity of the amplifier. The hat is formed by a base and a protrusion of the waveguide, the material forming the base being distinct from the material forming the protrusion.

14 Claims, 6 Drawing Sheets

(56) References Cited

OTHER PUBLICATIONS

Liang et al., "100 mm Integration of III-V and Silicon-on-Insulator Wafers for the Realization of Distributed Feedback Silicon Evanescent Lasers," *Proceedings of SPIE*, Jan. 1, 2008, pp. 71351O-1-71351O-7, vol. 7135.

International Search Report issued in International Application No. PCT/FR2011/000611 dated Mar. 29, 2012.

* cited by examiner

HETEROGENEOUS LASER WITH HIGH EFFICIENCY AND METHOD FOR MANUFACTURING THE LASER

BACKGROUND OF THE INVENTION

The present disclosure relates to a laser comprising:
a III-V heterostructure type amplifier, designed to generate photons,
a waveguide optically coupled to the amplifier, and comprising a hat-shaped cross-section, the top of which is proximal to the amplifier, the top of the hat and the lateral sides of the hat being covered with a dielectric material layer in the vicinity of the amplifier.

STATE OF THE ART

Silicon photonics (CMOS) addresses many fields of application, such as optical interconnections in integrated circuits, telecommunications, biophotonics, etc.

The integration of type III-V materials with silicon is now considered as an approach enabling to provide transmission characteristics which used to be inaccessible to silicon up to now.

Document "A distributed Bragg Reflector Silicon Evanescent Laser" by Alexander W. Fang et al., published in IEEE Photonics Technology Letters, Vol. 20, No 20, Oct. 15, 2008, describes a hybrid laser with a III-V heterostructure type coupled to a silicon waveguide. The waveguide is formed by a silicon protrusion at the bottom of a silicon cavity filled with air, the cavity enabling to select a specific laser wavelength. The lasing medium of the hybrid laser, of the type of an active waveguide formed in a III-V heterostructure, is optically coupled with the silicon waveguide partly due to a structuring of the active waveguide in front of the silicon waveguide.

Document "Electrically driven hybrid Si/III-V lasers based on adiabatic mode transformers" by B. Ben Bakir et Al., "PROCEEDING OF SPIE vol. 7719", Apr. 1, 2010, describes a ridge-type waveguide coupled to an amplifier. The forming of this waveguide requires specific measures on design thereof.

SUMMARY OF THE INVENTION

The object of the present invention aims at forming a laser structure having an improved efficiency with respect to prior art and having an improved design efficiency.

This goal is aimed by the appended claims and especially in that the hat is formed by a base and a protrusion of the waveguide, the material forming the base being different from the material forming the protrusion.

The present invention also relates to a method for manufacturing a laser, comprising the steps of:
  forming the waveguide on a first substrate and at least partially covering the waveguide at the top and on the sides of the hat with a first dielectric material layer,
  forming on a second substrate a stack of layers intended to form the heterostructure, the top of the stack being covered with a second dielectric material layer,
  placing the first substrate on the second substrate, and bonding by molecular bonding the first dielectric material layer to the second dielectric material layer,
  removing the second substrate,
  delimiting the III-V heterostructure type amplifier.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PARTICULAR EMBODIMENTS

The laser described hereafter differs from that of prior art in that the waveguide at least locally comprises in the vicinity of the amplifier a hat having its top and its sides covered with a dielectric material, preferably containing $SiO_2$.

Conventionally, on an optical circuit formed in a given plane, TE (transverse electric) and TM (transverse magnetic) polarization states are defined so that in state TE, the electric field is parallel to the circuit plane while the magnetic field is perpendicular to the circuit plane, and in state TM, the magnetic field is parallel to the circuit plane while the electric circuit is perpendicular to the circuit plane. Actually, in the laser, a quasi-TE polarization state, that is, an electric field mainly polarized according to direction TE, should implicitly be considered. Thus, the described laser structure will preferentially allow a coupling of the TE or quasi-TE mode of the wave.

Figure 1:
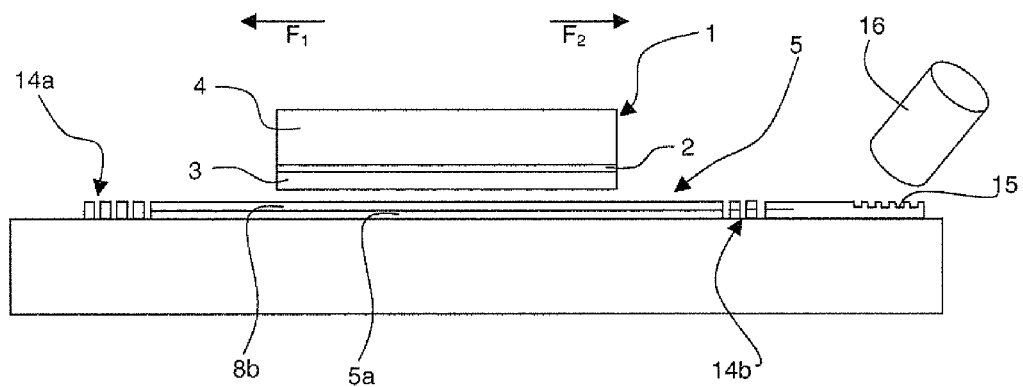
FIG. 1 illustrates a side view of the laser.
Figure 2:
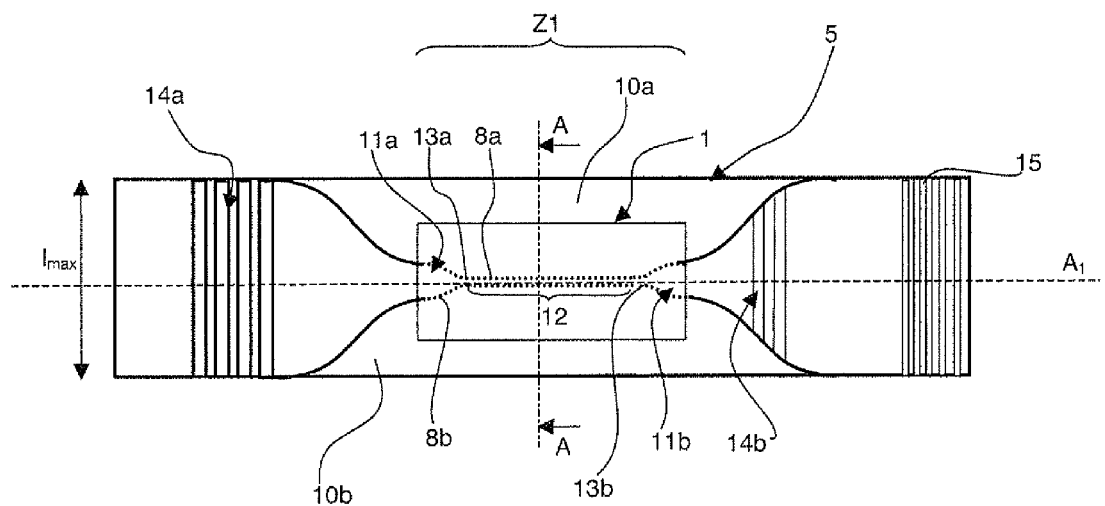
FIG. 2 illustrates a top view of the laser of FIG. 1.

FIGS. 1 and 2 illustrate a laser comprising III-V heterostructure type amplifier, the heterostructure being designed to generate photons, in other words, an optical wave. A III-V heterostructure type, means using materials likely to be selected from the following non-exhaustive list: InP, GaAs, InGaAlAs, InGaAsP, AlGaAs, InAsP. The heterostructure of such an amplifier 1, also called gain medium, may comprise a stack comprising a layer 2 provided with quantum elements, sandwiched between a first doped layer 3, preferably N doped, and a second doped layer 4, preferably P doped. First doped layer 3, when it is N doped, may comprise a material mostly selected from among InP, GaAs, InGaAsP, InGaAlAs, AlGaAs, InAsP. Second doped layer 4, when it is P doped, may comprise a material selected from among InP, GaAs, InGaAsP, InGaAlAs. In other words, the materials used for first layer 3 and second layer 4 may be the same, only the doping being changed. Of course, the doping may be inverted, that is, first doped layer 3 may be P doped, and second doped layer 4 may be N doped. Layer 2 of quantum elements may comprise quantum wells or quantum boxes allowing a recombination of holes and electrons to form photons, and thus generate the optical wave at the level of amplifier 1. The quantum elements may comprise a material such as InP, GaAs, InGaAsP, InGaAlAs, AlGa, As, InAsP.

The laser further comprises a waveguide 5 optically coupled to amplifier 1. In the specific example of an amplifier with three layers 2, 3, 4 such as illustrated in FIGS. 1 and 3, first doped layer 3 is proximal to waveguide 5.

Figure 3:
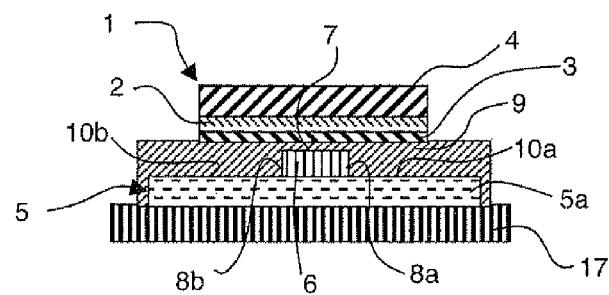
FIG. 3 illustrates a cross-section view along plane A-A of laser of FIG. 2.

In FIGS. 1 to 3, waveguide 5 comprises a section, preferably along plane A-A, substantially perpendicular to longitudinal axis A1 of waveguide 5, having the shape of a hat 6 having its top 7 proximal to amplifier 1. In other words, the optical coupling between amplifier 1 and waveguide 5 may be promoted at the level of top 7 of hat 6 by interaction of the electromagnetic fields, that is, of the system eigenmodes. Top 7 of hat 6 and lateral sides 8a, 8b of hat 6 are covered with a layer of a dielectric material 9 (not shown, for clarity, in FIGS. 1 and 2) in the vicinity of amplifier 1. Vicinity means that at the level of an area Z1 (FIG. 2) where waveguide 5 and amplifier 1 face each other, top 7 of hat 6 and lateral sides 8a, 8b of hat 6 are covered with dielectric material layer 9. Preferably, at least over the entire area Z1 where waveguide 5 and amplifier 1 face each other, the waveguide may have a hat-shaped cross-section and top 7 and sides 8a, 8b of hat 6 are covered with dielectric material layer 9. The distance separating the two sides 8a, 8b of the hat may vary in area Z1 to functionalize said area. In the specific example of FIGS. 1 and 2, amplifier 1 is arranged above waveguide 5, whereby the two partially overlap, top 7 of hat 6 being proximal to the amplifier and separated from said amplifier by at least one dielectric material 9. Preferably, the longitudinal axes of waveguide 5 and of amplifier 1 are parallel.

The dielectric material(s) separating waveguide 5 from amplifier 1 preferably have a low refractive index, for example, ranging between 1.4 (index close to that of silica) and 2.2 (index close to that of $Si_3N_4$ or $Al_2O_3$). It is spoken of a refractive index when considering a wave which propagates in an infinite three-dimensional material, its propagation speed being the speed of light divided by the refractive index.

The refractive index should not be confused with the effective index. Indeed, it is spoken of an effective index when considering a wave propagating in a specific geometry, for example, a waveguide. In such geometry, the field is altered, which means that the wave propagation speed is also altered. The propagation speed is equal to the speed of light divided by the effective index. The finite element method is used to calculate the effective index.

Sides 8a, 8b of hat 6 may be defined as longitudinal surfaces, substantially directed along longitudinal axis A1 of waveguide 5, and connecting top 7 of hat 6 to bottom 10a, 10b of hat 6. In other words, a least locally (at the level of area Z1 where amplifier 1 and waveguide 5 face each other) waveguide 5 may comprise a base 5a having a protrusion formed thereon, which delimits, with said base 5a, hat 6. The protrusion especially enables to delimit top 7 and sides 8a, 8b. Base 5a and the protrusion forming hat 6 may be made of a same material or of a different material. In the case where different materials are used, this provides a manufacturing advantage, since it is then possible to grow the protrusion, for example, of amorphous silicon, intended to form hat 6 on base 5a, thus avoiding an additional etch step. Bottom 10a, 10b of hat 6 corresponds to a surface of base 5a at the interface with sides 8a, 8b, that is, the surface of base 5a located on either side of the protrusion forming hat 6. The use of such a waveguide 5 enables to form a hat 6 interfacing with amplifier 1, and having lateral dimensions at the level of sides 8a, 8b smaller than maximum lateral dimensions $I_{max}$ of waveguide 5. This enables to promote a single-mode coupling of amplifier 1 with waveguide 5, especially when the distance separating the sides, in the vicinity of the amplifier, that is, in area Z1 where amplifier 1 and the waveguide face each other, ranges between 500 nm and 1,100 nm, while enabling to couple waveguide 5 to an optical fiber 16 by increasing the distance separating sides 8a, 8b of hat 6 outside of area Z1 until, preferably, it becomes equal to $I_{max}$ (the waveguide cross-section then becoming rectangular).

This structure of waveguide 5 may also be called ridge guide. The ridge guide at the level of area Z1 may comprise base 5a and the protrusion forming hat 6 only. In the ridge guide, the effective index of the modes is greater. It is also easier by construction to decrease the number of modes supported by the guide by decreasing the ridge width to promote a single-mode coupling.

Preferably, waveguide 5 contains silicon such as, for example, crystalline, amorphous, or even doped silicon. If waveguide 5 is desired to be functionalized, the silicon will be doped to add a new optical function, such as for example the variation of the refractive index by carrier injection. Generally, materials having a medium refractive index, like for example nitrided compounds such as $Si_3N_4$, SiON, or $Al_2O_3$, may also be used. Actually, silicon has a refractive index around 3.5, and silica has a refractive index ranging between 1.4 and 1.5, and thus, "mean refractive index" means a refractive index preferably ranging between 1.8 and 3. In the case where base 5a and hat 6 are made of different materials, base 5a may be made of silicon and, preferably, hat 6 is made of a nitrided compound.

Advantageously, base 5a may be made of crystalline silicon and the protrusion forming hat 6 with base 5a may be formed with a material selected from among amorphous silicon, polysilicon, $Si_3N_4$, $SiN_x$, $Al_2O_3$, $TiO_2$. In all cases, according to this embodiment, the materials between base 5a and the protrusion forming hat 6 are different. Actually, when complex photonic circuits are formed, several functions are associated for the spatial and spectral distribution of light. Such functions are highly dependent on the optogeometrical parameters of the formed structures. For example, a error of a few nanometers across the thickness of a multiplexer/demultiplexer in length may offset the optical response (also called spectral comb), which error may result in that the system is no longer capable of complying with the specifications of the initial circuit design. Thereby, the optical functions of the components no longer properly concatenate and there is a high risk of obtaining a non-functional general optical circuit. When an etching is performed on a circuit, there always is an uncertainty as to the etched thickness. There also is a dispersion of the etching (and thus of the thickness) at the wafer level. The use of two different materials thus enables to solve the above-mentioned issue.

In addition to the undeniable advantage of using two different materials for the manufacturing method, such a use also provides a structural advantage. Indeed, the use of different materials implicitly induces that the protrusion and the base will have different effective indexes. In other words, it will be possible to promote the location of the optical mode rather in the protrusion or in the base. Such a location may be important according to the laser use. In a first case considering an identical coupling force between amplifier 1 and waveguide 5, if the presence of the mode is promoted in the protrusion to the detriment of base 5a, the thickness of layer 9 (preferably made of oxide) separating waveguide 5 and amplifier 1 will be larger than when the presence of the optical mode is promoted in the base. This enables, among others, to select a compromise between the coupling efficiency and the decrease of laser dimensions. In a second case where the thickness of layer 9 is fixed, it will be possible to select the materials to influence the coupling force on design of the laser.

"Different materials" means materials differing by their structures or their natures. Thus, the selectivity will be lower when two materials differing by their structure (crystalline Si, polycrystalline Si, or amorphous Si) are used.

A mode corresponds to a spatial configuration of the electromagnetic field such as previously defined (TE or quasi-TE component). Typically, an optical wave comprises a plurality of modes. "Single-mode" means that a single one of the modes is optically coupled. When the system is coupled as in the case of the laser, it is spoken of supermodes. The eigenmodes, also called local modes, are those of waveguide 5 and of amplifier 1 taken individually. The supermodes are linear combinations of the local modes.

According to the field distribution in the coupled system, each supermode is assigned a propagation constant and thus a specific effective index. An effective index is the ratio of the phase speed of the optical wave in vacuum (speed of light c) to the phase speed of the wave associated with the optical mode.

Dielectric material layer 9 covering top 7 and sides 8a, 8b of hat 6 in the vicinity of amplifier 1 may be made of SiO$_2$. Dielectric material layer 9 improves the laser efficiency by varying the optoelectronic characteristics (especially the thermal and optical components) thereof. The encapsulation of hat 6, at least at the level of its top 7 and of its sides 8a, 8b, with dielectric material layer 9 enables to decrease propagation losses due to roughnesses for example obtained on structuring of the hat. Indeed, the rougher the external surfaces of waveguide 5, the more the wave propagating through waveguide 5, especially during the optical coupling between waveguide 5 and amplifier 1, risks diffusing outside of waveguide 5, thus limiting the laser efficiency. Dielectric material layer 9 then enables, by decreasing the refractive index contrast (for example, the contrast of air with respect to silicon as in prior art is greater than the contrast of SiO$_2$ with respect to silicon) and by filling the unevennesses of waveguide 5, to limit diffusion effects. Dielectric material layer 9 also enables to improve the laser efficiency since it behaves as a thermal conductor, enabling to diffuse outside of the laser gain area (area comprising the quantum wells) part of the heat generated by the laser on operation thereof, conversely to prior art where air has an extremely low heat conductivity. A good thermal conductor material will preferably be selected. Decreasing these two effects adversely affecting the laser synergically enables to greatly improve the laser efficiency. Materials such as SiO$_2$, Al$_2$O$_3$, TiO$_2$, SiON, HfO$_2$, Si$_3$N$_4$ are particularly appropriate candidates to decrease such thermal and optical effects.

According to an improvement, bottom 10a, 10b of hat 6 is thus covered with dielectric material 9 in the vicinity of amplifier 1.

As illustrated in FIG. 3, the entire waveguide 5, except for a surface in contact with a substrate 17 supporting waveguide 5, may also be covered with dielectric material 9 to diffuse at best the heat generated by the laser during its operation. When waveguide 5 is covered with a dielectric material of SiO$_2$ type, this is also specifically advantageous in the manufacturing method. Indeed, it is then possible to form waveguide 5 and amplifier 1, or the layers intended to form amplifier 1, on two different substrates, to cover the latter with an SiO$_2$ layer, and then to use SiO$_2$—SiO$_2$ molecular bonding techniques to place waveguide 5 in front of the associated amplifier 1. The molecular bonding may also very well operate by using Al$_2$O$_3$-on-SiO$_2$ interfaces, Al$_2$O$_3$ then being capable of forming a thin layer deposited at the level of the III-V heterostructure.

Preferably, be it by a single layer, or a layer obtained by molecular bonding of two dielectric material layers, preferably identical, waveguide 5 and amplifier 1 will be separated by the dielectric material both in contact with waveguide 5 and with amplifier 1. The separation distance may range between 5 nm and 500 nm. In fact, the larger the spacing, the longer the coupling, all thus depending on the targeted application. A long laser may emit much more power, and a short laser will emit less power but will be more compact and less power consuming.

According to a development, the distance separating the two sides 8a, 8b of hat 6 in the vicinity of amplifier 1 ranges between 500 nm and 1,100 nm. Such a distance enables to form a waveguide 5 of high effective index. This distance is then optimized to promote the single-mode optical coupling over the multiple-mode coupling at the level of areas of optical coupling of waveguide 5 with amplifier 1. An area where the optical coupling is strongly promoted between waveguide 5 and amplifier 1 defines a coupling area. Preferably, the laser comprises two optical coupling areas arranged at the ends of area Z1 where waveguide 5 faces amplifier 1 along longitudinal axis A1. At the level of the coupling areas, the distance separating the two sides 8a, 8b of the hat preferably ranges between 700 nm and 1,100 nm.

Preferably, each coupling area has a length, along the longitudinal axis of the waveguide, which is an odd multiple of coupling length $L_c$, and preferably equal to $L_c$.

The optimal coupling efficiency (F) is defined as being the power fraction transmitted from a first guide to a second guide (here, from waveguide 5 to amplifier 1) at the end of a characteristic distance $L_c$.

$$F = 1 - \left(\frac{\Delta n_{eff,L}}{\Delta n_{eff,S}}\right)^2, \quad (1)$$

$$\text{with } L_c = \frac{\lambda}{2\Delta n_{eff,S}}, \quad (2)$$

where:

$\lambda$: is the operating wavelength.

$\Delta n_{eff,L}$: is the difference between the effective indexes of the modes supported by the first and second guides in the absence of coupling (the guides are taken individually). Such guided modes are called local modes.

$\Delta n_{eff,S}$: is the difference between the effective indexes of the modes supported by the coupling structure comprising the two juxtaposed guides. These two supermodes are of opposite symmetry by construction. It will then be spoken of symmetrical and antisymmetrical supermodes. This physical quantity is dependent on distance Di which separates the two guides. It conditions coupling length $L_c$ as well as the transferred power rate.

It should be noted that the power transfer from one guide to the other is a harmonic, and thus reversible process. Considering a nominal power $P_0$ injected into the first guide, the power collected or transmitted in the second guide at position z has the following expression:

$$P_{1 \rightarrow 2}(z) = P_0 \cdot F \sin^2\left(\frac{\pi}{2L_c} \cdot z\right) \quad (3)$$

It should be noted according to relation (3) that the power transfer from the first guide to the second guide is optimal for odd multiples of the characteristic coupling length.

According to the dimensions of hat 6, a single mode of the wave, preferably in TE or quasi-TE component, may be coupled. Generally, the dimensions of waveguide 5 and of amplifier 1 will be selected according to the mode to be coupled.

According to a development illustrated in FIG. 2, the laser may comprise a first mode transformer 11a and a second mode transformer 11b, each formed in waveguide 5 at a respective end of area Z1 where amplifier 1 and waveguide 5 face each other according to longitudinal axis A1 of waveguide 5. A mode transformer enables to form at least one optical coupling area as discussed hereinabove, and to progressively and optimally transfer the mode confined in amplifier 1 towards waveguide 5 or conversely. Mode transformer 11a, 11b enables to do away with constraints relative to the sizing of waveguide 5 and of amplifier 1 to optimize the coupling. Indeed, to couple as efficiently as possible a waveguide 5 with amplifier 1, it is possible to form the two with identical effective indexes, such an embodiment however implying a perfect alignment and sizing, this being difficult to achieve. The shape of waveguide 5 may then be studied to obtain a coupling which is robust with respect to the optogeometrical variations induced during the manufacturing. Mode transformers 11a, 11b are thus present, on the one hand, to overcome possible design shortcomings and, on the other hand, to provide an optimum optical coupling. A mode transformer may for example be formed by varying the distance separating the two sides 8a, 8b of hat 6 while keeping a constant maximum lateral dimension $I_{max}$ at the base level.

Actually, in the case of a direct coupling where the width of the silicon guide is invariant along the propagation axis, the effective indexes should be strictly identical, to obtain a 100% coupling, which creates a constraint as to the definition of the hat width, that is, of the ridge to match the effective indexes. The second constraint is that the optimal coupling can only be achieved on a specific distance, which is the beat length or coupling length (Lc) discussed hereinabove. If the length is smaller than Lc, the coupling will not totally be achieved. If the length is greater than Lc, the coupling will be performed over a distance Lc, after which the mode will partly decouple along the remaining distance (for a length L=2*Lc, the mode returns to its initial state). Thus, there will be a tendency to use odd multiples of Lc greater than one to increase the effective optical coupling probability.

In the case of an adiabatic coupling by mode transformer, the width of waveguide 5 at the input of mode transformer 11a, 11b is designed so that the effective index of waveguide 5 is smaller than the effective index of amplifier 1 (which remains invariant along the propagation axis). The inverse line of argument is applied for the width of waveguide 5 at the exit of mode transformer 11a, 11b. Thus, all along the mode transformer, the effective index will be smaller, equal, and then greater than the effective index of the amplifier, and the optical power may thereby be progressively coupled (and this, reversibly, from guide to amplifier or from amplifier to guide).

Another advantage of mode transformers is that the coupling is efficient from a given length, and it remains substantially identical according to designs beyond this length. Indeed, without using mode transformers, there would tend to be a very long waveguide/amplifier overlapping at the level of the coupling areas to increase the probabilities of an efficient coupling. Mode transformers 11a, 11b enable to do away with this issue by for example using a length equal to Lc for the optical coupling area.

Figure 4:
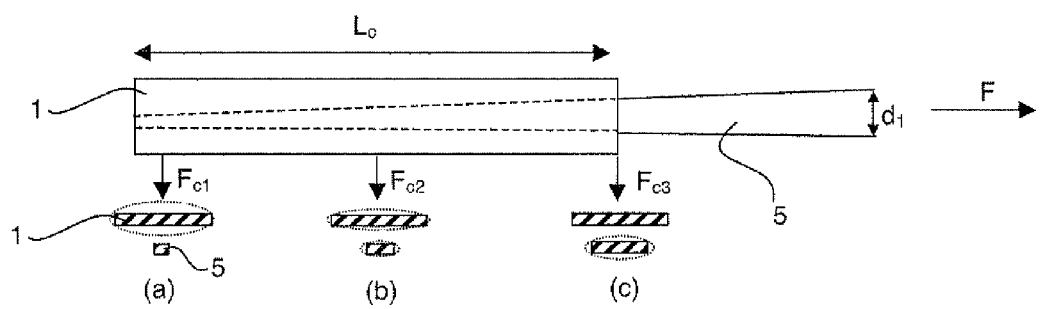
FIG. 4 schematically illustrates the operation of a mode transformer.

This principle is illustrated in FIG. 4, from left to right in FIG. 4, where variable cross-section waveguide 5 has a diverging shape along the direction indicated by arrow F, corresponding to a variation of its lateral dimension $d_1$. Amplifier 1 arranged above waveguide 5 has a constant cross-section. A wave is shown by dotted lines at the level of cross-sections (a), (b), (c), perpendicular to displacement direction F of said wave, said cross-sections being respectively indicated by arrows $F_{c1}$, $F_{c2}$, $F_{c3}$. The wave is first confined in amplifier 1 (a), after which, as the cross-section of waveguide 5 widens ($d_1$), the effective indexes become closer and the wave is little by little coupled to waveguide 5 (b) until it is totally coupled (c) at coupling length Lc (at the beginning, the effective index of the guide is smaller than the effective index of the amplifier, after which there is a phase matching with the effective index of the guide equal to the effective index of the amplifier, after which the effective index of the guide becomes greater than the effective index of the amplifier). The adapted structuring of waveguide 5 enables the laser, by modal transformation, to fully take advantage of the available gain. This is possible since in a central portion of the laser (portion between the two mode transformers), the electromagnetic field (that is, the mode) is mainly confined in the active area (lasing medium) and the overlapping with the quantum wells is maximum, thus enabling to reinforce the modal gain and to decrease the laser threshold with respect to prior art. Such a modal transformation is then adiabatic, and it guarantees at the ends of the laser an optimal coupling towards an underlying photonic circuit.

Figure 5:
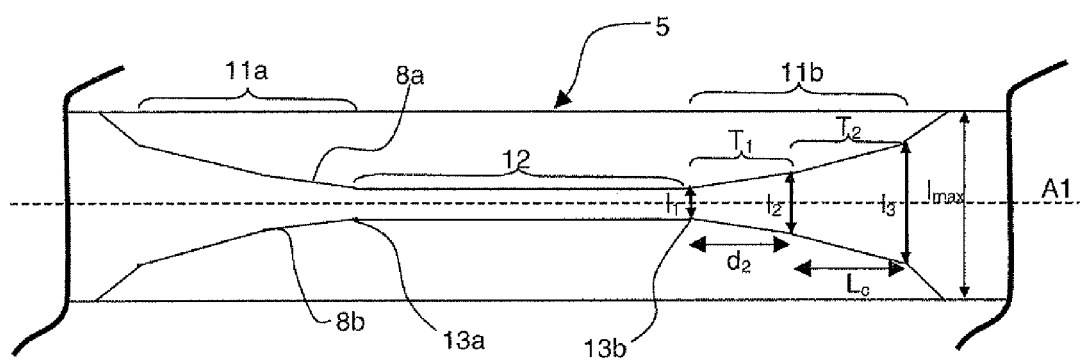
FIG. 5 illustrates a specific embodiment of the waveguide comprising mode transformers, the view being a top view of the waveguide centered on the waveguide area intended to face the amplifier.

Preferably, as illustrated in FIG. 5, each mode transformer 11a, 11b may comprise a first section $T_1$ arranged to limit the loss generated by diffraction processes in a coupling from amplifier 1 to waveguide 5, and the process being reversible, the same occurs in the coupling from waveguide 5 to the amplifier. First section $T_1$ may be divergent (towards the right of the drawing), and on section $T_1$, the distance separating the two sides 8a, 8b of the hat varies between $I_1$ and $I_2$ with, preferably $I_1$=500 nm and $I_2$=700 nm, over a length $d_2$ of several microns (typically some ten, and preferably ranging between 2 μm and 20 μm). Then, mode transformer 11a, 11b may comprise a second so-called optimized collection section $T_2$ located after first section $T_1$ along its divergence direction. Second section $T_2$ preferably has a length substantially equal to coupling length Lc necessary to totally couple the wave of amplifier 1 to waveguide 5 or conversely. Second section $T_2$ is preferably also diverging in the same direction as first section $T_1$. On second section $T_2$, the smallest dimension $I_2$ separating the two sides 8a, 8b of hat 6 may be 700 nm while the largest dimension $I_3$ separating the two sides 8a, 8b of the hat may be 1,100 nm. After second section $T_2$, the distance separating the two sides 8a, 8b of hat 6 may increase until it becomes equal to the maximum lateral dimension $I_{max}$ of waveguide 5, that is, until hat 6 disappears to form a waveguide 1 having a generally rectangular cross-section. According to a variation, not shown, $I_{max}$ may be equal to $I_3$. At the level of waveguide 5, first sections $T_1$ of the two mode transformers 11a, 11b are proximal and diverge in two opposite directions substantially parallel to longitudinal axis A1. Mode transformers 11a, 11b are preferably separated by a hat portion 12 preferably having a constant cross-section, at the level of which the distance separating the two sides 8a, 8b of the hat is smaller than or equal to $I_1$.

Thus, according to a development, each of the first and second mode transformers 11a, 11b forms a bottleneck 13a, 13b defined by sides 8a, 8b of hat 6. The two bottlenecks 13a, 13b may then be directed towards each other to delimit, between them, portion 12 forbidding or very strongly limiting any optical coupling between waveguide 5 and amplifier 1 to confine the wave in amplifier 1 in the vicinity of portion 12 of hat 6.

In FIGS. 2 and 5, between the two mode transformers 11a, 11b, waveguide 5, and more specifically the distance separating sides 8a, 8b of hat 6, is sized to avoid or to very strongly limit an optical coupling between amplifier 1 and waveguide 5. Thus, the wave is confined in the amplifier to be amplified therein. In other words, a dimension of the hat which will be located so that the effective index of the guide is smaller than the effective index of the amplifier will be selected between the two mode transformers 11a, 11b. As an example, the sizing avoiding or limiting the optical coupling may be achieved by a narrowing of the distance separating sides 8a, 8b of hat 6 over a portion 12 of hat 6 directed along longitudinal axis A1, with this distance typically being smaller than or equal to 500 nm.

In a laser such as described, the wave generated in amplifier 1 may propagate both along opposite directions, substantially parallel to longitudinal axis A1 of waveguide 5, said directions being indicated by arrows $F_1$ and $F_2$ in FIG. 1. Thus, in the direction indicated by arrow $F_1$, the wave may pass from amplifier 1 to waveguide 5, for example, at the level of first mode transformer 11a, and then reach a first reflector 14a directing it along direction $F_2$, after which the wave is coupled back with amplifier 1, possibly at the level of first mode transformer 11a (FIG. 2), crosses the amplifier, and is then coupled to waveguide 5, preferably at the level of second mode transformer 11b, after which the wave may come across a second reflector 14b sending it back along the direction indicated by arrow F1 to cross amplifier 1 again, etc. First and second reflectors 14a, 14b then form a cavity of the laser enabling the wave to run across amplifier 1 several times to be amplified therein. One of the reflectors preferably is a reflective element and the other one is a semi-reflective element to let a laser wave out once its power is sufficient. In the specific example of FIGS. 1 and 2, first reflector 14a is reflective and second reflector 14b is semi-reflective.

The laser cavity preferably comprises two Bragg mirrors. Each of these mirrors has a different reflectivity. Thus, first reflector 14a may be a Bragg mirror having a reflectivity higher than 90% and second reflector 14b may also be a Bragg mirror, having a reflectivity on the order of 50%. Such an asymmetry enables to transfer the laser mode in a preferred direction, for example, towards an output array 15 coupled to a fiber 16 at the output of second reflector 14b, the output of second reflector 14b facing amplifier 1.

As a summary, waveguide 5 may be seen as a longitudinal element directed along axis A1 in FIGS. 1 and 2, and capable of comprising several successive areas having different functionalities. From left to right, FIG. 2 then shows a reflective area defined by first reflector 14a, followed by an area where the cross-section of waveguide 5 is shaped as a hat 6, if it is not already so, to have a semi-reflective area defined by second reflector 14b. The semi-reflective area may be followed by a so-called output array 15 for example enabling to couple the laser with an optical fiber 16. According to the laser structure, first reflector 14a and second reflector 14b are formed in waveguide 5, on either side of amplifier 1 in an area where waveguide 5 has a rectangular cross-section or a hat-shaped cross-section. Between reflectors 14a, 14b, stands area Z1.

The laser may further comprise a modulator arranged to code information at a laser exit. Such a modulator may be arranged, for example, in waveguide 5, between second semi-reflective reflector 14b and output array 15. Such a modulator may for example be of electro-absorption or of Mach Zehnder type. The modulator may comprise type III-V and/or silicon materials.

To form waveguide 5, a waveguide, for example, made of silicon, forming a rib having a rectangular cross-section perpendicularly to axis A1, and having a maximum height of, preferably, 500 nm and a width of, preferably, 10 μm may be selected, and such a rib may be structured to form the different areas, and especially hat 6.

In the embodiment where waveguide 5 is formed of different materials, only the upper layer proximal to the amplifier will be structured to form the hat and the materials will be structured to form the first and second reflectors.

The reflective and semi-reflective areas, formed by first and second reflectors 14a, 14b, may be obtained by etching of the waveguide, perpendicularly to longitudinal axis A1 along its entire 500-nm height and its 10-μm width. In other words, waveguide 5 is locally interrupted to create areas of variable reflectivity. This may be achieved by etchings forming trenches along the entire height and width of waveguide 5, said trenches having an axis substantially perpendicular to longitudinal axis A1 of waveguide 5. Instead of the trenches, it is possible to form bidimensional periodic arrays of holes such as photonic crystals. In fact, an array of holes may replace the parallel trench lines, such a configuration being capable of improving the reflective power of reflectors.

Array 15 of coupling with optical fiber 16 may comprise an array of trenches partially formed in waveguide 5, for example, by etching thereof. Preferably, the trenches are substantially perpendicular to longitudinal axis A1 of waveguide 5, and are formed on the upper surface of waveguide 5, the upper surface being, in FIG. 1, the surface of waveguide 5 facing upwards and substantially parallel to the plane of waveguide 5 or, as in FIG. 2, the surface of waveguide 5 in the sheet plane. For a waveguide 5 according to the previously-mentioned dimensions, the trenches may have a 125-nm depth. The array may for example be defined by using a hard mask, and then performing a directional etching.

Between the reflective and semi-reflective areas, the waveguide comprises a hat-shaped section capable of being obtained by using a hard mask structuring waveguide 5 (be it made of one or two different materials, as discussed hereinabove). The height of hat 6, and thus of sides 8a, 8b, is preferably 250 nm. In other words, in the corresponding area, base 5a of waveguide 5 has a thickness substantially equal to 250 nm, and its base 5a has the longitudinal protrusion extending thereon, the longitudinal protrusion forming with base 5a, hat 6. The distance separating the two lateral sides 8a, 8b of the hat may, as discussed hereinabove, have a variable dimension along longitudinal axis A1 of waveguide 5 to delimit mode transformers 11a, 11b and, between mode transformers 11a, 11b, delimit portion 12 of waveguide 5 where the optical coupling between waveguide 5 and amplifier 1 is not possible or is very strongly disadvantaged. Thus, still from left to right in FIG. 2, the hat-shaped area may comprise a first narrowing of the distance separating sides 8a, 8b to form a first mode transformer 11a, and a second narrowing (forming bottleneck 13a) arranged to avoid any optical coupling between waveguide 5 and amplifier 1 at the level of said second narrowing. After the second narrowing and after portion 12, the distance separating the two sides may be increased to form second mode transformer 11b. Preferably, between a mode transformer 11a, 11b and reflector 14a, 14b located close to said mode transformer 11a, 11b, the distance separating the two sides 8a, 8b progressively takes back a value close or even equal to maximum lateral dimension $I_{max}$ of the waveguide.

The different sizings of waveguide 5 and of amplifier 1 may be obtained by simulation methods for example using software suite RSOFT®. For example, to calculate the eigenmodes and the propagation constants, or equivalently, the associated effective indexes, the finite element method of RSOFT® module FEMSIM may be used. The coupling efficiency may be calculated by using the beam propagation method (BPM) such as defined in RSOFT© module BeamProp. To calculate the nanostructured elements, like the reflectivity of first and second reflectors 14a, 14b, the trenches of array 15 for the coupling with an optical fiber 16, the finite-difference time-domain FDTD method of RSOFT® module Fullwave may be used. Software PHOTODESIGN may also be used to characterize the laser. Although the structure has a strong influence on the coupling length, advantageously, Lc ranges between 25 µm and 500 µm. Due to these software suites, the electromagnetic calculations (effective indexes, calculations and coupling lengths, field mapping, etc.) of the laser can be easily obtained.

To form the structure of the above-described laser, a substrate of SOI (Silicium On Insulator) type may be used. The waveguide may then be formed in a 500-nm silicon membrane. Such a silicon membrane may be supported by a thermal oxide layer supported by silicon having a thickness of several hundreds of microns. In a step of the manufacturing method (FIG. 6), waveguide 5 may be formed on a first substrate 17 and, for example, it may be structured such as previously described. Waveguide 5 is then at least partially covered (at the level of sides 8a, 8b and of top 7 of hat 6 in the vicinity of the future amplifier), and preferably entirely, with a first dielectric material layer 9a, typically $SiO_2$, $Al_2O_3$, or $Si_3N_4$. During its forming, waveguide 5 advantageously comprises a base and a protrusion made of different materials such as described hereinabove. As indicated, the use of different materials enables to more easily manufacture the laser, especially by using the selectivity of the materials. For example, one may first manufacture the passive functions in a single-crystal SOI by forming one or several rib guides in the SOI substrate to form the previously-mentioned base, for example, with a 250-nm thickness. Once the base has been formed, polycrystalline Si may be deposited, after which, for example following a lithography and etching step, the protrusion is formed, for example, to form the hat and advantageously the mode transformers.

On a second substrate 18, a stack of layers intended to form the III-V heterostructure type amplifier may be formed by depositing, for example, successively on second substrate 18, second doped layer 4, layer 2 provided with quantum elements, first doped layer 3, second doped layer 4 being proximal to second substrate 18. A second dielectric material layer 9b covers the top of the stack opposite to second substrate 18. Second dielectric material layer 9b is compatible for a molecular bonding with first dielectric material layer 9a of first substrate 17, typically $SiO_2$, to allow an $SiO_2$—$SiO_2$ molecular bonding.

Figure 6:
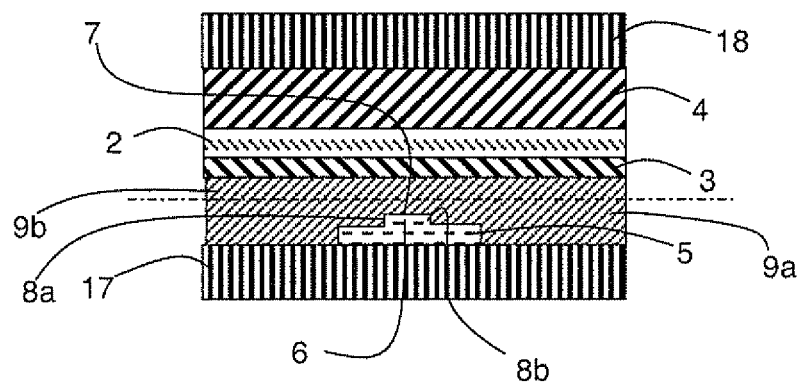
FIGS. 6 to 13 illustrate a specific example of a method for manufacturing the laser.
Figure 7:
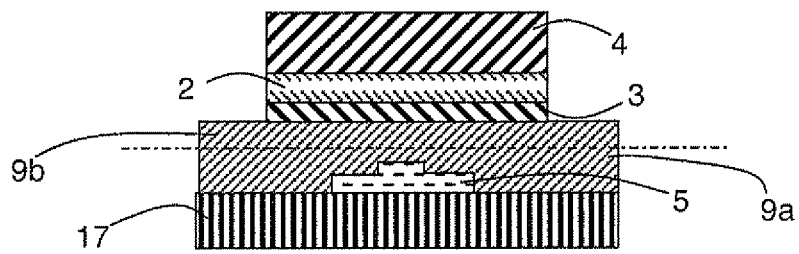
Figure 8:
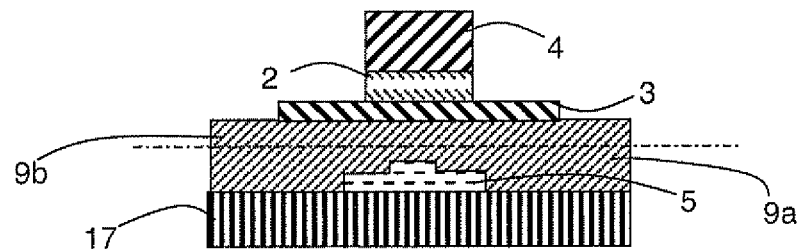

Then, preferably, after planarizing dielectric material layers 9a, 9b of the two substrates 17, 18, first substrate 17 may be placed on second substrate 18 (FIG. 6) to place first dielectric layer 9a in contact with second dielectric layer 9b, to bond them, for example, by molecular bonding, by arranging the stack above waveguide 5. In FIGS. 6 to 8, the dotted line fictitiously shows the limit of the molecular bonding after the bonding has been performed. After the molecular bonding, it can be considered that a single dielectric material layer separates waveguide 5 from amplifier 1.

After the molecular bonding, second substrate 18 is removed, after which the stack is structured to delimit, at least in its general shape, the III-V heterostructure type amplifier 1 (FIG. 7). To achieve this, second doped layer 4, layer 2 of quantum elements, and first doped layer 3 are etched all the way to second dielectric material layer 9b (which may form, after the molecular bonding with first dielectric material layer 9a, a single dielectric material layer). Such etchings may be wet etchings performed via highly-selective chemical etchings enabling to stop the etching on a specific layer while having a high etch speed, typically 10 µm/min, to be compared with 100 nm/min for a dry RIE (reactive ion etching). When first substrate 17 comprises a plurality of waveguides, a different heterostructure will be delimited above each waveguide 5 according to the same method. According to a specific example, second doped layer 4 is made of InP, and will be etched with HCl at 37% pure or diluted with $H_2O$, layer 2 provided with quantum elements is made of InGaAsP, and will be etched with $H_2SO_4/H_2O_2/H_2O$ (1/1/10 in proportion), and first doped layer 3 is made of InP, and will be etched with 37% HCl, pure or diluted with $H_2O$.

Then, the III-V heterostructure type may be partially etched (second doped layer 4 and layer 2 of quantum elements) all the way to first doped layer 3 (FIG. 8) to make first doped layer 3 accessible to form an electric contact therein. Preferably, after etching, the accessible areas of first doped layer 3, in top view, have a U shape (FIG. 9) delimited at the level of the heterostructure edges, the legs of the U, having a free end, are substantially parallel to longitudinal axis A1 of waveguide 5. The partial etching of the III-V heterostructure type is a difficult manufacturing step. This etch step may be carried out by preferably using a hard mask deposited at the top of the heterostructure, and adequately structured to form a U by lithography of the mask resin. Typically, it is possible to obtain a rectangular shape which is approximately 5 µm wide and 1,000 µm long, having its length directed along the longitudinal axis of waveguide 5 after development of the resin. The hard mask may be formed by deposition of a nitride over 900 nm by PECVD followed by the deposition of a positive resin and a lithography followed by an etching of the mask with an SF6 plasma. The etching of the stack can then be broken up in two steps. In a first step, according to the hard mask, second doped layer 4 is etched with a $CH_4/H_2$ plasma, stopping at layer 2 of quantum elements, after which the latter is etched, preferably by $H_2SO_4/H_2O_2/H_2O$ chemistry (1/1/10 in proportion) all the way to first doped layer 3. The chemical solutions used are highly selective over first doped layer 3 to stop there without etching it. The two etch steps may be verified by control of the etching depth, for example, by a profilometric method and electric testing. The hard mask may be removed after this control. In the case where the hard mask contains SiNx, it may be removed by SF6 plasma.

Figure 9:
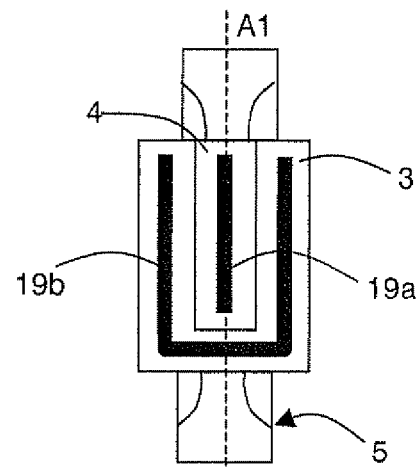
Figure 10:
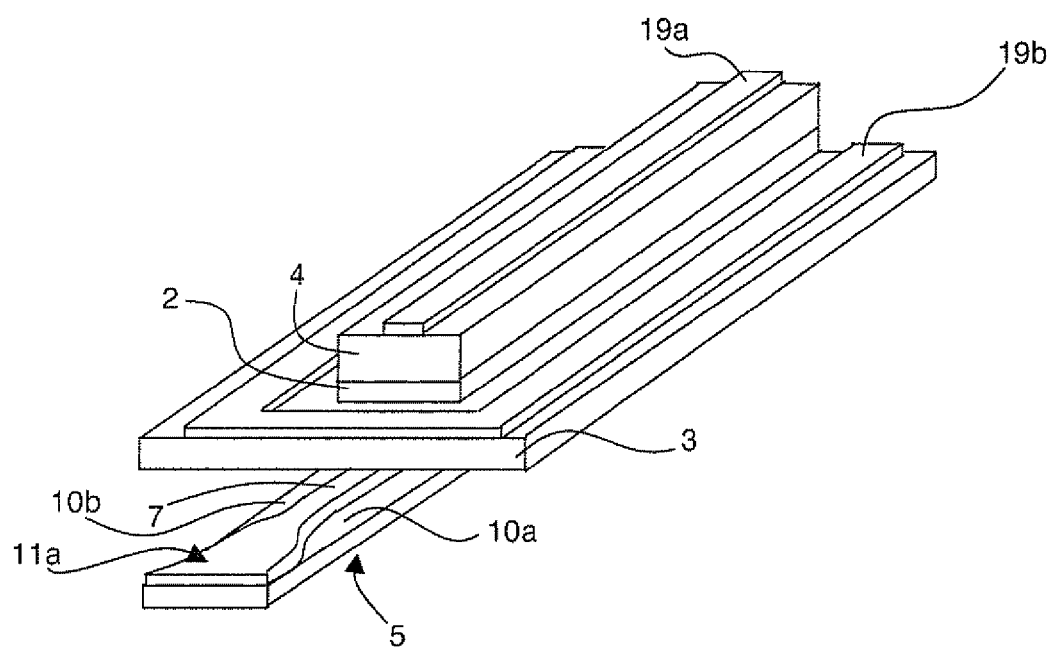

As illustrated in FIGS. 9 and 10, first and second electric contacts 19a, 19b to are then formed at the heterostructure level. First contact 19a is formed at the top of the stack on second doped layer 4, and second contact 19b is formed on first doped layer 3 and preferably forms a U partially surrounding layer 2 of quantum elements. Contacts 19a, 19b may be formed by using a mask, a metal deposition, and a lift-off method. The contacts enable the final device to generate photons and thus the optical wave.

To improve the electric contact with first and second doped layers 3, 4, first and second contacts 19a, 19b may for example be annealed by rapid anneal at 400° C., "rapid" meaning an anneal time preferably ranging between 30 seconds and 150 seconds. The advantage of this anneal is the significant decrease of the electric contact resistance at the level of first and second contacts 19a, 19b.

Disregarding the dielectric material layer(s) separating waveguide 5 from amplifier 1, after forming of the contacts, the laser is illustrated in three dimensions in FIG. 10. FIG. 10 illustrates waveguide 5 optically coupled with the amplifier, and mode transformer 11a faces the amplifier at its longitudinal end. Contacts 19a, 19b respectively in contact with second doped layer 4 and with first doped layer 3 can be clearly located.

In the case where several lasers are formed and connected to a same substrate 17, electric connections are suppressed between each device to make them electrically independent.

Figure 11:
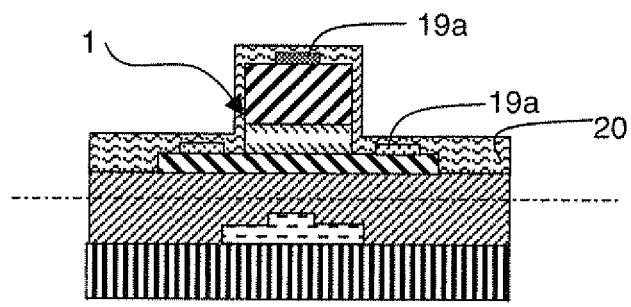
Figure 12:
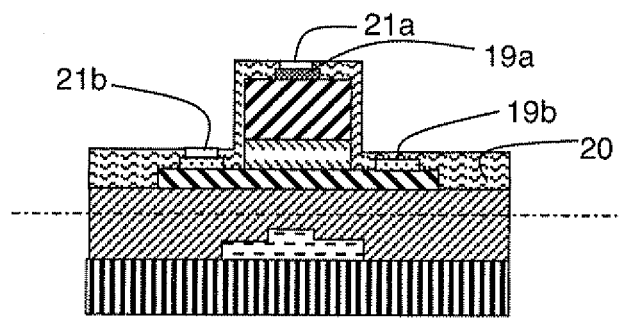

The laser can operate by injecting current at the level of contacts 19a, 19b. However, coming into electric contact therewith is not easy since they are not located in a same plane. Thus, an additional step may comprise forming contacting elements in a same plane. To achieve this, an electrically-insulating passivation layer 20 may be conformally deposited on the laser (FIG. 11) to cover at least the heterostructure (amplifier 1). Passivation layer 20 then takes a hat shape. Passivation layer 20 is then opened (FIG. 12) on the one hand at the level of first contact 19a to form a first opening 21a leaving said first contact 19a accessible, and on the other hand at the level of second contact 19b to form a second opening 21b leaving a portion of second contact 19b accessible. Openings 21a, 21b aim at widening of the contacts by subsequently depositing a metal layer. Second opening 21b is preferably formed above a leg of the U forming second contact 19b.

Figure 13:
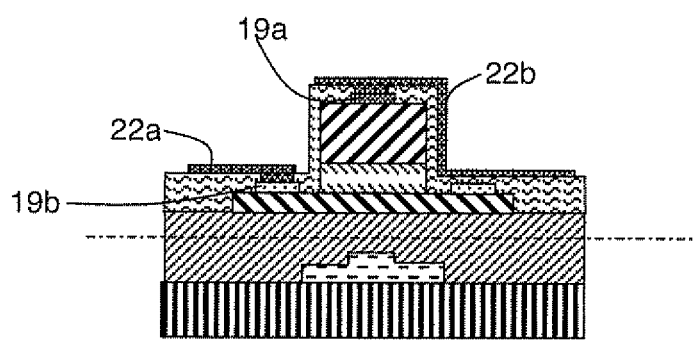

In FIG. 13, the selective deposition or deposition followed by etching, of a metal layer enables to form, on passivation layer 20, to the left of layer 2 of quantum elements in FIG. 13, a first contacting element 22a in electric contact with second contact 19b. A second contacting element 22b, in electric contact with first contact 19a, at least partly covers the top of the hat formed by passivation layer 20 above first contact 19a, the edge of the hat of passivation layer 20 joining the bottom of the hat of the passivation layer (to the right of layer 2 in FIG. 13) and the bottom of the hat of passivation layer 20 to the right of quantum element layer 2 in FIG. 13. Then, first contacting element 22a covering the bottom of the hat to the left of quantum element layer 2 is formed in the same plane as an area of second contacting element 22b covering the bottom of the hat of passivation layer 20 to the right of quantum element layer 2 in FIG. 13. The first and second contacting elements are electrically independent.

Due to this structure, the contacts can be taken in a same plane.

Figure 14:
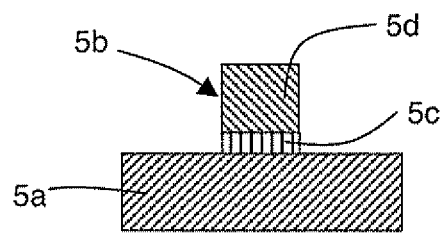
FIG. 14 illustrates an alternative embodiment of the waveguide.

According to a specific embodiment illustrated in FIG. 14, the protruding element 5b of base 5a delimiting the hat with said base 5a, appears in the form of a bilayer delimiting a stack. In this bilayer, a first layer 5c, advantageously in direct contact with base 5a, is made of an electrically-insulating material (dielectric) such as oxide or SiNx. The other layer 5d is made of a material selected from among amorphous silicon, polysilicon, $Si_3N_4$, $SiN_x$, $Al_2O_3$, $TiO_2$. First layer 5c has two advantages, the first one being that it enables, according to its thickness, to promote the distribution of the optical wave mode as discussed previously, the other advantage being the laser manufacturing method. Indeed, there is a high selectivity between Si and oxides in general, which selectivity may typically be greater than 40 between Si and $SiO_2$. It is thus simpler to define a hat by the reactive ion etching technique (RIE) due to the obtaining of an etch stop signal resulting from the detection of the material forming first layer 5c. Such a detection may be formed by a measurement equipment which then specifies the detection of the end of etching of the concerned material. In other words, in the above targeted method, first substrate 17 may comprise a successive stack of a layer intended to form base 5a of waveguide 5, of an electrically-insulating layer intended to form first layer 5c of the protruding element, and of a layer intended to form second layer 5d of protruding element 5b. This stack of three layers may then be simply and optimally structured by using the properties of selectivity of the different materials, while avoiding to etch base 5a at the end of the structuring of protruding element 5b. For selectivity issues, first layer and second layer 5c, 5d are advantageously made of different materials.

Figure 15:
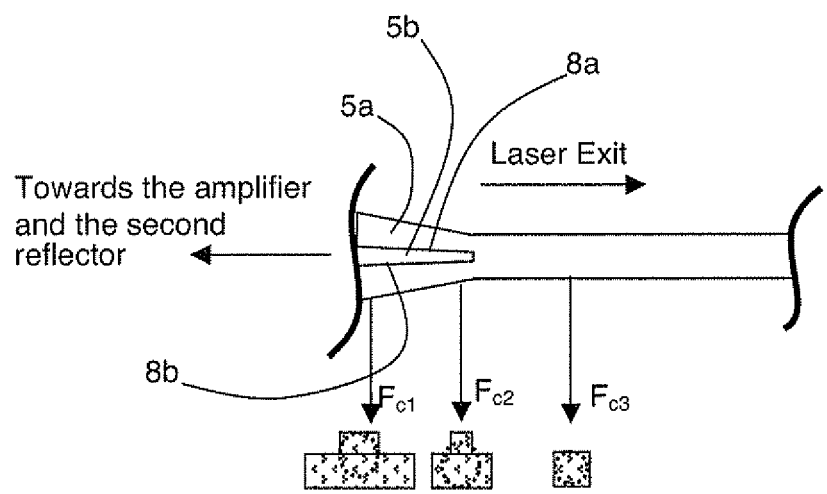
FIG. 15 illustrates a specific embodiment of a laser exit.

According to a variation which may be applied to the different embodiments and illustrated in FIG. 15, the laser exit may be specially configured, advantageously downstream of the second reflectors, to avoid losses between protrusion 5b and base 5a. In other words, it is possible to provide an adiabatic transition and a progressive confinement of the optical mode towards base 5a by only decreasing the separation distance of lateral sides 8a, 8b of protruding element 5b until the protrusion is interrupted in a direction opposite to the amplifier. In FIG. 15, arrows Fc1, Fc2, Fc3 show cross-sections of the waveguide where the circles in dotted lines show the mode of the optical wave. It can be clearly seen that according to the laser output direction, the optical mode is little by little confined in the base until protruding element 5a is interrupted. Advantageously, base 5a also has lateral dimensions which decrease towards the exit to decrease the bulk and form a passive waveguide towards an active component.

The invention claimed is:

1. A laser comprising:
 a III-V heterostructure amplifier designed to generate photons,
 a waveguide optically coupled to the III-V heterostructure amplifier, the waveguide comprising:
  a base element made from a first material,
  a protrusion element made from a second material different from the first material, formed on the base element to define in the base element covered and uncovered areas with the protrusion element,
 a dielectric material layer covering a top face and side walls of the protrusion element, the dielectric material layer separating the III-V heterostructure amplifier and the protrusion element.

2. The laser of claim 1 wherein the said uncovered area in the base element with the protrusion element is covered with the dielectric material.

3. The laser of claim 1 wherein the dielectric material layer is made from $SiO_2$.

4. The laser of claim 1 wherein the said uncovered area in the base element with the protrusion element is covered with the dielectric material, the dielectric material being $SiO_2$.

5. The laser of claim 1 wherein the dimension of the protrusion element along an axis parallel to a plane comprising the said uncovered area in the base element with the protrusion element, ranges between 500 nm and 1,100 nm.

6. The laser of claim 1 wherein the III-V heterostructure amplifier and the waveguide face each other in an area extending along a longitudinal axis of the waveguide, the waveguide comprising at a respective end, along the longitudinal axis, of the said area a first mode transformer and a second mode transformer.

7. The laser of claim 1 wherein the III-V heterostructure amplifier and the waveguide face each other in an area extending along a longitudinal axis of the waveguide, the waveguide comprising at a respective end, along the longitudinal axis, of the said area a first mode transformer and a second mode transformer, the first mode transformer being a bottleneck-shaped formed in the protrusion element.

8. The laser of claim 1 comprising a modulator configured to code information at an exit of the laser.

9. The laser of claim 1 wherein at an exit of the laser, the protrusion element has a tapered-shape which is narrowing, in a longitudinal direction opposite to the III-V heterostructure amplifier, until interruption of the protrusion element.

10. The laser of claim 1, wherein the protrusion element is formed by a stack of a first dielectric layer in direct contact with the base element, and of a second layer made from a material selected from among amorphous silicon, polysilicon, $Si_3N_4$, $SiN_x$, $Al_2O_3$, $TiO_2$.

11. The laser of claim 1, wherein the protrusion element is formed by a stack of a first dielectric layer in direct contact with the base element, and of a second layer made from a material selected from among amorphous silicon, polysilicon, $Si_3N_4$, $SiN_x$, $Al_2O_3$, $TiO_2$, and wherein the said uncovered area in the base element with the protrusion element is covered with the dielectric material.

12. A method for manufacturing the laser of claim 1, comprising the following steps:
   forming on a first substrate a waveguide comprising a base element interposed between a protrusion element and the first substrate, the protrusion element defining in the base element covered and uncovered areas with the protrusion element,
   covering the waveguide with a first layer of dielectric material,
   forming on a second substrate a stack of layers configured to form a III-V heterostructure,
   covering the top of the stack with a second layer of dielectric material,
   contacting the first layer and the second layer so as to perform a molecular bonding of the first substrate to the second substrate,
   removing the second substrate,
   delimiting the stack of layers forming the III-V heterostructure to form an optical amplifier.

13. The method of claim 12, wherein the first and second layers are made from $SiO_2$.

14. A laser comprising:
   a III-V heterostructure amplifier, designed to generate photons,
   a waveguide, optically coupled to the III-V heterostructure amplifier, and comprising a hat-shaped cross-section the top of which is proximal to the III-V heterostructure amplifier, the top of the hat and the lateral sides of the hat being covered with a dielectric material layer in the vicinity of the III-V heterostructure amplifier,
   wherein the waveguide comprises a base element provided with a protrusion element, the material forming the base element being different from the material forming the protrusion element.

* * * * *